US012685181B2

(12) United States Patent
Morand et al.

(10) Patent No.: US 12,685,181 B2
(45) Date of Patent: Jul. 14, 2026

(54) METHOD AND DEVICE FOR MAKING INTEGRATED COOLING LIQUID CAVITY IN PRINTED CIRCUIT BOARD

(71) Applicant: MITSUBISHI ELECTRIC CORPORATION, Tokyo (JP)

(72) Inventors: Julien Morand, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 449 days.

(21) Appl. No.: 18/036,281

(22) PCT Filed: Jun. 16, 2021

(86) PCT No.: PCT/JP2021/024051
§ 371 (c)(1),
(2) Date: May 10, 2023

(87) PCT Pub. No.: WO2022/153577
PCT Pub. Date: Jul. 21, 2022

(65) Prior Publication Data
US 2024/0014046 A1 Jan. 11, 2024

(30) Foreign Application Priority Data
Jan. 15, 2021 (EP) ..................................... 21305046

(51) Int. Cl.
*H01L 21/48* (2006.01)
*H01L 21/56* (2006.01)
(Continued)

(52) U.S. Cl.
CPC .......... *H01L 21/4857* (2013.01); *H01L 21/56* (2013.01); *H01L 23/3121* (2013.01); *H01L 23/473* (2013.01); *H01L 25/072* (2013.01)

(58) Field of Classification Search
CPC ............... H01L 21/4857; H01L 21/486; H01L 23/3121; H01L 23/473; H01L 25/072; H01L 25/0657
See application file for complete search history.

(56) References Cited

U.S. PATENT DOCUMENTS 9,839,130 B1 * 12/2017 Betsui ............... H01L 23/49822
2001/0001897 A1 5/2001 Zhao et al.
(Continued)

OTHER PUBLICATIONS

International Search Report (PCT/ISA/210) issued in PCT/JP2021/024051, dated Nov. 3, 2021.
(Continued)

*Primary Examiner* — John M Parker
(74) *Attorney, Agent, or Firm* — Birch, Stewart, Kolasch & Birch, LLP

(57) ABSTRACT

The present invention concerns a method and a device for making an integrated cooling liquid cavity in a printed circuit board by inserting a power semiconductor die in a dielectric material, laminating the dielectric material with a dielectric material and a thin electrically conducting layer on each side of the dielectric material, drilling vias through the laminated copper and dielectric layers, metallizing the vias in order to form a first printed circuit board, laminating a dielectric material, a soluble material having a predetermined form and an electrically conducting layer on the first printed circuit board, injecting solvent in the soluble material in order to dissolve the soluble material and reveal a cavity injecting cooling liquid in the revealed cavity.

4 Claims, 6 Drawing Sheets

(51) Int. Cl.
| | |
|---|---|
| *H01L 23/31* | (2006.01) |
| *H01L 23/473* | (2006.01) |
| *H01L 25/07* | (2006.01) |

(56) References Cited

U.S. PATENT DOCUMENTS

| | | | |
|---|---|---|---|
| 2001/0010627 A1* | 8/2001 | Akagawa | ............... H01L 24/97 361/764 |
| 2005/0112798 A1 | 5/2005 | Bjorbell | |
| 2005/0161803 A1* | 7/2005 | Mihara | ................... H01L 24/24 257/737 |
| 2007/0254411 A1 | 11/2007 | Uhland | |
| 2016/0172278 A1 | 6/2016 | Collin et al. | |
| 2018/0226310 A1 | 8/2018 | Eid et al. | |
| 2019/0123030 A1* | 4/2019 | Mrad | ................... H01L 23/645 |
| 2020/0098669 A1 | 3/2020 | Elsherbini et al. | |

OTHER PUBLICATIONS

Written Opinion of the International Searching Authority (PCT/ISA/237) issued in PCT/JP2021/024051, dated Nov. 3, 2021.

* cited by examiner

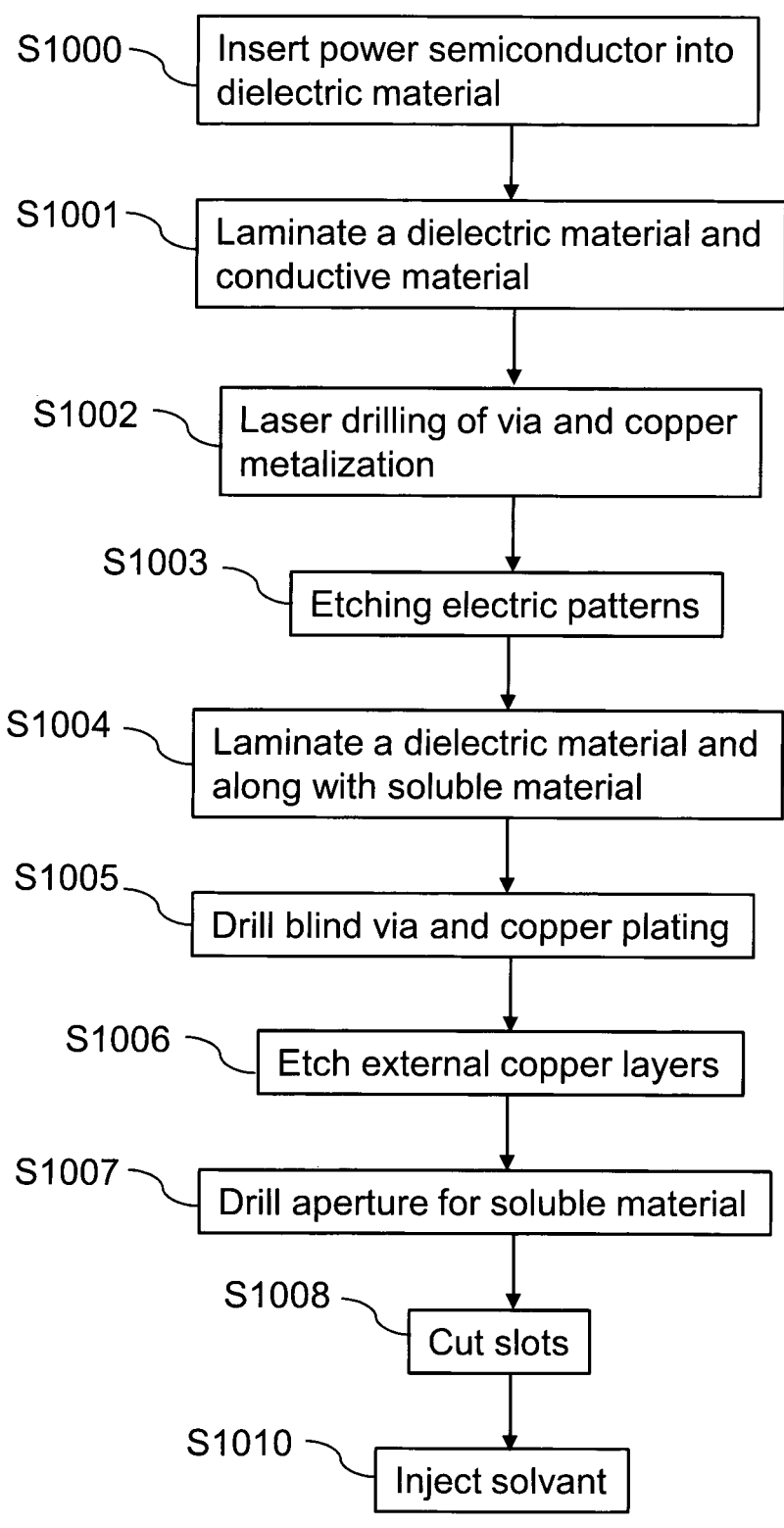

S1000 — Insert power semiconductor into dielectric material

S1001 — Laminate a dielectric material and conductive material

S1002 — Laser drilling of via and copper metalization

S1003 — Etching electric patterns

S1004 — Laminate a dielectric material and along with soluble material

S1005 — Drill blind via and copper plating

S1006 — Etch external copper layers

S1007 — Drill aperture for soluble material

S1008 — Cut slots

S1010 — Inject solvant

Fig. 10

METHOD AND DEVICE FOR MAKING INTEGRATED COOLING LIQUID CAVITY IN PRINTED CIRCUIT BOARD

TECHNICAL FIELD

The present invention relates generally to an integrated cooling liquid cavity in a printed circuit board and a method to make the same.

BACKGROUND ART

A general trend in power electronics is to increase the power density of converters. This trend is driven by application specific requirements. As an example, in electro mobility applications the increase in power density allows to allocate more space to the passenger compartment and the saved weight helps to extend the range or reduce Co2 emission in the case of Hybrid Electric Vehicle (HEV). In consumer electronic applications, a more compact power converter is the key to miniaturization as it can clearly be seen in smartphone or laptop chargers.

The constant increase of the switching frequency and the power density lead to an urgent need for thermal enhancement of power electronic packaging.

An emerging solution in power packaging is to embed the die into a substrate, mostly a Printed Circuit Board (PCB) and to connect the power die with vias.

With the advent of Wide Band Gap semiconductor, such as Silicon Carbide (SiC) and Gallium Nitride (GaN), the combination of smaller die area, a higher operating temperature and compact packaging required for high frequency operation is shrinking the available surface for heat extraction. In this context, every part of the path followed by the heat needs to be optimized. Apart from the thermal interface material layer, in the context of embedded die packaging, the layer made of filled copper vias and remaining dielectric material is the bottleneck of this heat path. From the quest of a higher power density for converters stems an increased heat flux density in the vicinity of the die. The aforesaid limited density of copper micro vias is currently impeding the heat transfer capabilities of high-power embedded die power packaging.

SUMMARY OF INVENTION

The present invention aims to provide an integrated cooling liquid cavity in a printed circuit board and a method to make the same.

To that end, the present invention concerns a method for making an integrated cooling liquid cavity in a printed circuit board, characterized in that the method comprises the step of:

inserting a power semiconductor die in a dielectric material, laminating the dielectric material with a dielectric material and a thin electrically conducting layer on each side of the dielectric material, drilling vias through the laminated copper and dielectric layers, metallizing the vias in order to form a first printed circuit board, laminating on a same plane a dielectric material, a soluble material having a predetermined form and an electrically conducting layer on the first printed circuit board, injecting solvent in the soluble material in order to dissolve the soluble material and reveal a cavity, injecting cooling liquid in the revealed cavity.

The present invention concerns also a device for making an integrated cooling liquid cavity in a printed circuit board, characterized in that the device comprises:

means for inserting a power semiconductor die in a dielectric material, means for laminating the dielectric material with a dielectric material and a thin electrically conducting layer on each side of the dielectric material, means for drilling vias through the laminated copper and dielectric layers, means for metallizing the vias in order to form a first printed circuit board, means for laminating on a same plane a dielectric material, a soluble material having a predetermined form and an electrically conducting layer on the first printed circuit board, means for injecting solvent in the soluble material in order to dissolve the soluble material and reveal a cavity, means for injecting cooling liquid in the revealed cavity.

Thus, the coolant is in direct contact with the closest electrically conducting layer reducing drastically the thermal path between the die and the coolant.

According to a particular feature, the method comprises the step, prior injecting the solvent, of drilling blind vias through the electrically conducting layers.

According to a particular feature, the method further comprises the step of coating/plating the blind vias.

Thus, an electrical continuity is provided between the electrically conducting layers and the electrically conducting layers above the to-be-revealed cavity will be supported by these vias.

According to a particular feature, the method comprises the step, prior injecting the cooling liquid, of coating/plating the revealed cavity.

Thus, the manufacturing of the cavity inside a printed circuit board is possible by the usage a soluble part. Indeed, this part holds the pressure during all the lamination steps and prevents the uncured dielectric material to flow in the future cavity. Since this part is entrapped in the printed circuit board structure, only a soluble material could be used.

According to a particular feature, the soluble material is Polyvinyl alcohol, Butenediol Vinyl Alcohol Co-polymer or inorganic salts in a compressed form.

The characteristics of the invention will emerge more clearly from a reading of the following description of example embodiments, the said description being produced with reference to the accompanying drawings.

BRIEF DESCRIPTION OF DRAWINGS

FIG. 10 represents an example of an algorithm for realizing an integrated cooling liquid cavity in a printed circuit board according to the invention.

DESCRIPTION OF EMBODIMENTS

Figure 1A:
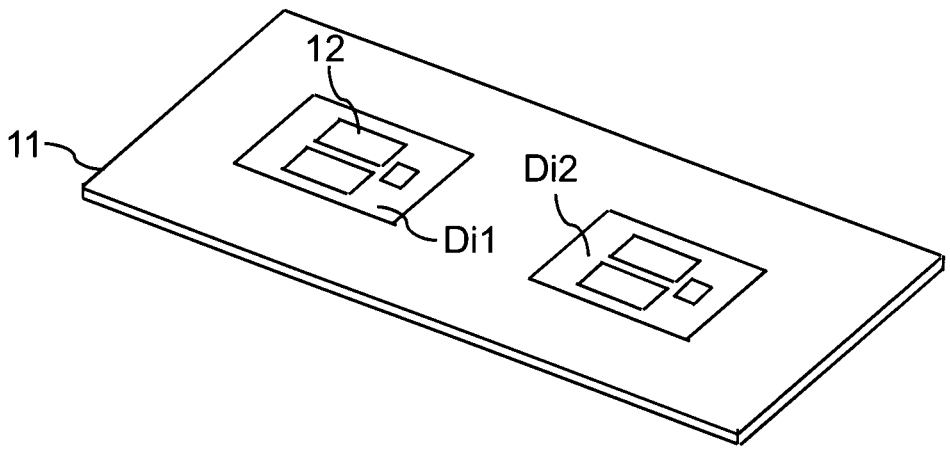
FIG. 1*a* represents power semiconductors that are inserted into a dielectric material.

FIG. 1a represents power semiconductors that are inserted into a dielectric material.

In the example of FIG. 1, the dielectric material 11 has a first and a second cavities in which respective power semiconductor dies Di1 and Di2 are inserted.

The thickness of the core is close to the one of the die to be inserted. Electrodes of the dies 12 are shown in FIG. 1.

Figure 1B:
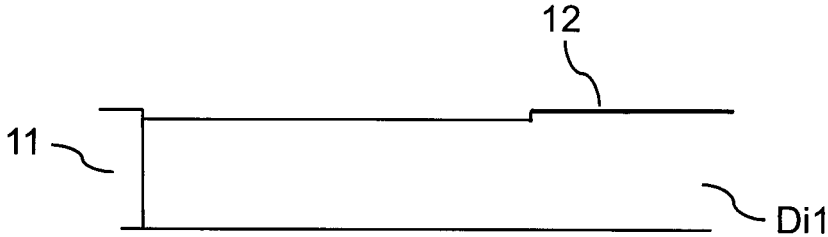
FIG. 1*b* represents an enlarged sectional view of a die inserted into the dielectric material.

The FIG. 1b represents an enlarged sectional view of the die Di1 inserted into the dielectric material 11.

Figure 2:
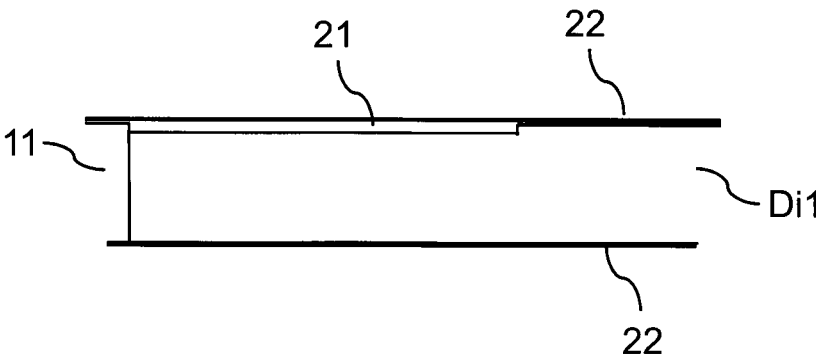
FIG. 2 represents a printed circuit board after a laminating of a dielectric material and of a layer of conductive material on each side.

The FIG. 2 represents the dielectric material 11 after a laminating of a dielectric material 21 and of a thin electrically conductive material 22 like for example copper layer on each side of the dielectric material 11 in order to obtain a printed circuit board 20.

During lamination, the dielectric material 21 is flowing into the space left in the cavity and therefore "trapping" the die Di1 into the printed circuit board 20.

A that stage, the top and bottom electrodes of the die are not connected to electrically conductive materials.

Figure 3:
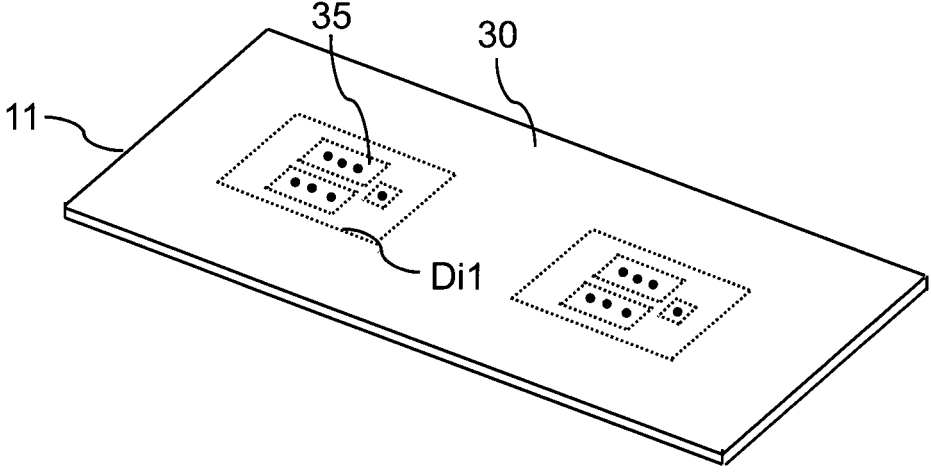
FIG. 3 represents the printed circuit board after laser drilling of vias.

FIG. 3 represents a printed circuit board 30 after laser drilling of vias on the printed circuit board 20.

After laser drilling of vias at a micrometric scale through both the electrically conductive materials and dielectric layers, a metallization of the vias provides electrical continuity using, for example, a sequence made of copper electroless and electro plating.

Figure 4:
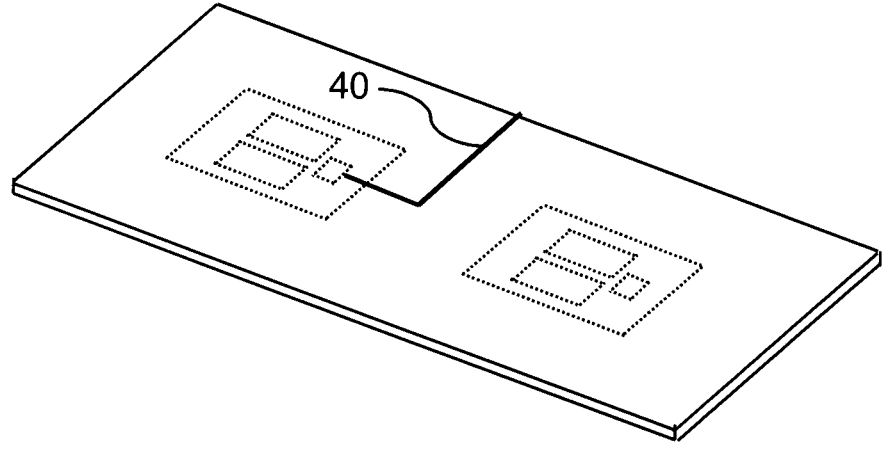
FIG. 4 represents the etching of electrical conducting material of the printed circuit board.

FIG. 4 represents the etching of electrical conducting material of the printed circuit board.

This step creates the desired circuitry connecting the power die electrodes with external components.

Only the connexion 40 of the grid of the die is shown in FIG. 4 for the sake of clarity.

Figure 5:
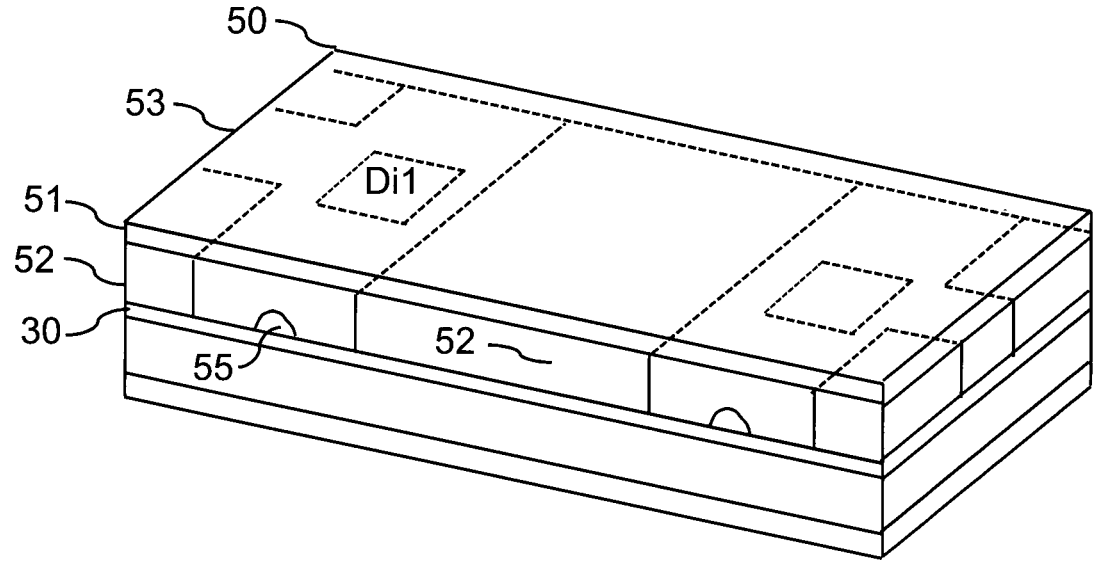
FIG. 5 represents the printed circuit board after a lamination of dielectric material along with a specifically formed stamp made of soluble material and a thick electrically conducting layer lamination.

FIG. 5 represents the printed circuit board 50 after a lamination of dielectric material along with a specifically formed stamp made of soluble material and a thick electrically conducting layer lamination.

On top of the electrically conducting layers 22, a lamination of dielectric material 52 along with a specifically formed stamp 53 made of soluble material is done. Simultaneously with the dielectric material, a thick electrically conducting layer 51 is laminated on top of it. In the example of FIG. 5, the soluble material is T-shaped. The part made of soluble material features a half-pipe like shape 55 running through the whole part and has at least one outlet directed towards the edge of the final device. This specific shape is meant to allow a minimum liquid flow to initiate a dissolution step. Other shape can be used for the cavities as long as it permits the liquid flow and hold the lamination pressure.

Preferably, the soluble material is soluble into the cooling liquid material which will be used, at least partially, during cooling. For example, the cooling liquid material is water. For example, the soluble material is Polyvinyl alcohol (PVA) which can stand a lamination temperature. For example, the soluble material is Butenediol Vinyl Alcohol Co-polymer. For example, the soluble material is inorganic salts like for example NaCl in a compressed form.

Figure 6:
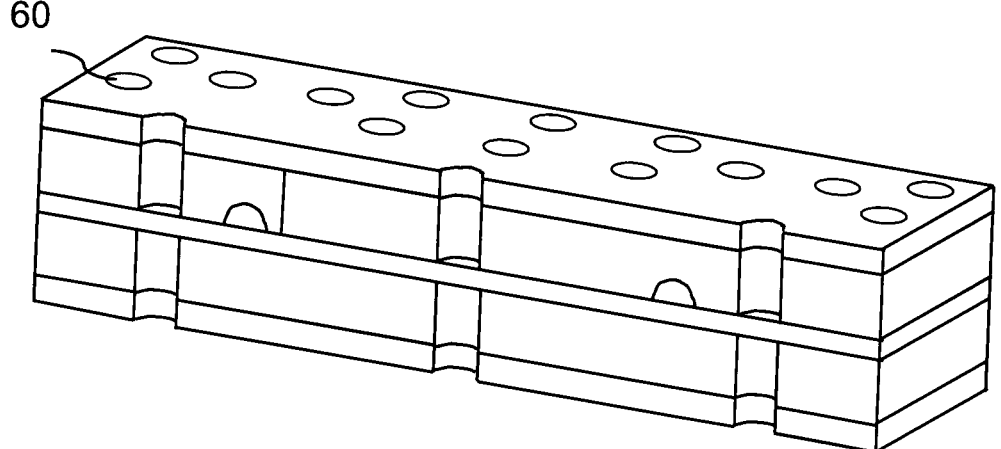
FIG. 6 represents the printed circuit board after a mechanical drilling of blind vias.

FIG. 6 represents the printed circuit board after a mechanical drilling of blind vias. Blind vias 60 are mechanically drilled through the thick copper 51 layer up to the thin electrically conducting layer 22. These vias serve two purposes. The first one is to provide electrical continuity between the outer to the inner electrically conducting layer. The second one is to act as pillar for the to-be revealed cavity. These pillars will hold the thick electrically conducting layer bridging over the cavity. The vias 60 are called structural vias. The structural vias are for example copper plated. The goal of plating the vias 60 is to create a barrier to coolant and a plating thickness of only a few tens of micro meter is necessary. The vias 60 may be filled with a polymer resin if extra strength is required.

Figure 7:
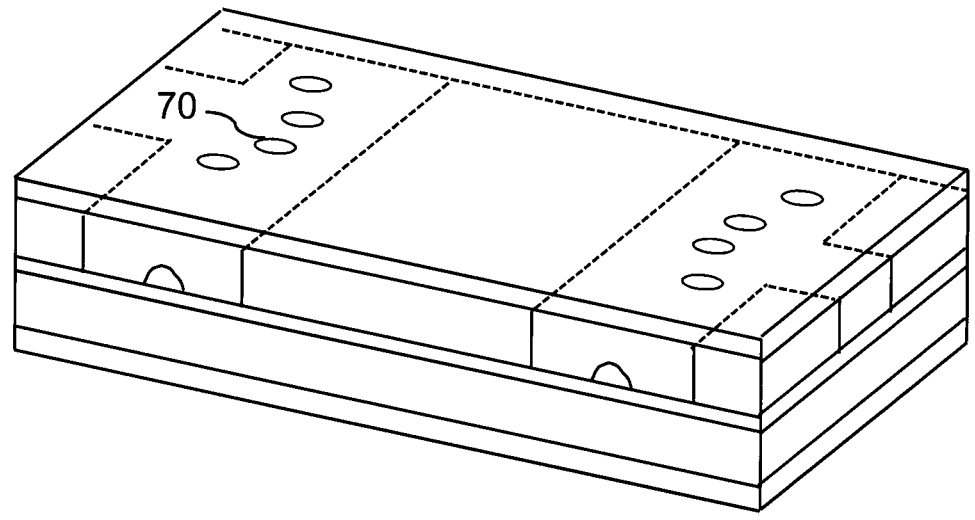
FIG. 7 represents the printed circuit board after a drilling of apertures used for the cooling of the power semiconductors.

FIG. 7 represents the printed circuit board after a drilling of apertures used for the cooling of the power semiconductors.

The apertures 70 that are used for the cooling are machined by a standard milling/drilling system. Depending on the application, the apertures can be holes or more complex shaped cavities. The depth of this aperture is slightly smaller than the sum of the thick electrically conducting layer and the soluble material. The apertures 70 are located on top of the soluble material and will reveal a half-pipe like shape 55 in the soluble material.

Figure 8:
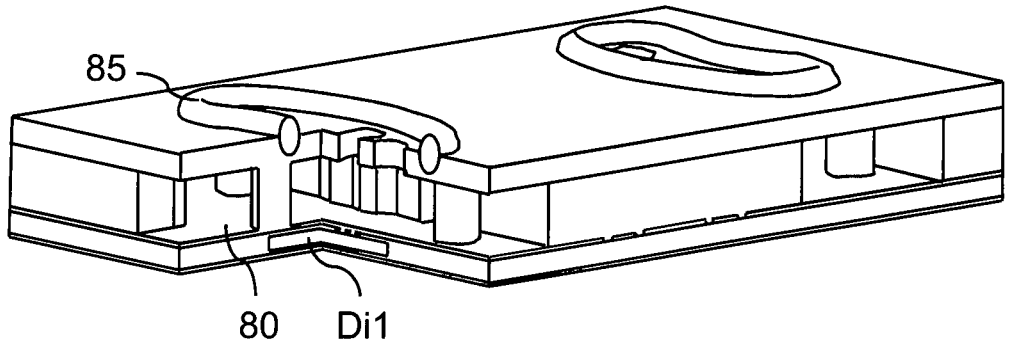
FIG. 8 represents a sectional view of the printed circuit board after the integrated cooling liquid cavity realization.

FIG. 8 represents a sectional view of the printed circuit board after the integrated cooling liquid cavity realization.

The slots on each side of the printed circuit board are cut-out to allow the liquid to flow. A nozzle 85 is placed at the entrance of some or all apertures. The solvent is flowing through the apertures and continue through the cavities and finally exit by the side of the printed circuit board. During injection, the material is dissolving, and an internal structure is progressively revealed under the thick electrically conducting layer. The injection step ends when all the soluble material is fully removed.

At this stage, the pillars surface, the floor and the ceiling of the internal structure 80 are made of electrically conducting material, the other walls are made of dielectric material (prepreg). Generally, the dielectric materials used on printed circuit board manufacturing are hydrophilic and tend to swell after absorbing water-based liquids. To create a coolant tight cavity, an electro-less and an electro-deposition are done. As for the structural vias 60, the required thickness for the plating is dictate by the need of having a coating protecting the dielectric material from the coolant.

Figure 9:
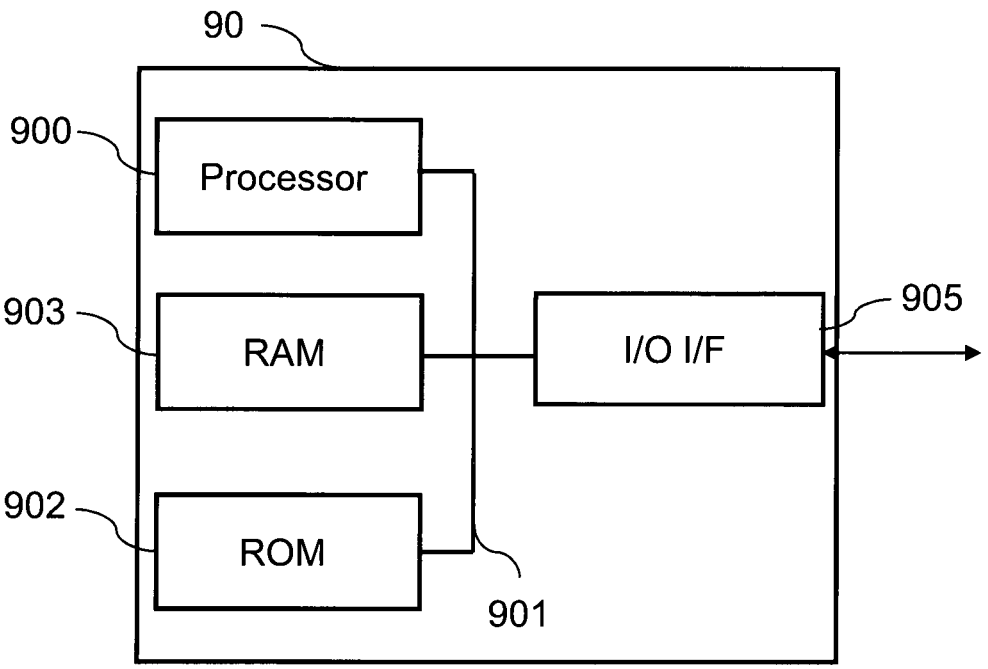
FIG. 9 represents an architecture of a device for realizing an integrated cooling liquid cavity in a printed circuit board according to the invention.

FIG. 9 represents an architecture of a device for realizing an integrated cooling liquid cavity in a printed circuit board with an integrated cooling liquid cavity according to the invention.

The device for realizing an integrated cooling liquid cavity in a printed circuit board 80 has, for example, an architecture based on components connected together by a bus 901 and a processor 900 controlled by a program as disclosed in FIG. 10.

The bus 901 links the processor 900 to a read only memory ROM 902, a random access memory RAM 903 and an input output I/O IF interface 905.

The memory 903 contains registers intended to receive variables and the instructions of the program related to the algorithm as disclosed in FIG. 10.

The read-only memory, or possibly a Flash memory 902, contains instructions of the programs related to the algorithm as disclosed in FIG. 10, when the device for realizing an integrated cooling liquid cavity in a printed circuit board 80 is powered on, are loaded to the random access memory 903. Alternatively, the program may also be executed directly from the ROM memory 902.

The control performed by the device for realizing an integrated cooling liquid cavity in a printed circuit board 80 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the device for realizing an integrated cooling liquid cavity in a printed circuit board 80 includes circuitry, or a device including circuitry, causing the device for realizing an integrated cooling liquid cavity in a printed circuit board 80 to perform the program related to the algorithm as disclosed in FIG. 10.

FIG. 10 represents an example of an algorithm for realizing an integrated cooling liquid cavity in a printed circuit board according to the invention.

At step S1000, power semiconductors are inserted into a dielectric material.

In the example of FIG. 1, the dielectric material 11 has a first and a second cavities in which respective power semiconductor dies Di1 and Di2 are inserted.

The thickness of the core is close to the one of the die to be inserted.

At step S1001, the dielectric material 11 is laminated with a dielectric material 21 and a layer of electrically conductive material 22 on each side of the dielectric material 11.

During lamination, the dielectric material 21 is flowing into the space left in the cavity and therefore "trapping" the die Di1 into the printed circuit board 20.

At step S1002, a laser drilling of via at a micrometric scale is performed through both the electrically conducting layer and dielectric layers and a metallization of the vias is done using, for example, a sequence made of electro-less and electro plating.

At step S1003, the desired circuitry connecting the power die electrodes with external components is created.

Only the connexion 40 of the grid of the die is shown in FIG. 4 for the sake of clarity.

At step S1004, a lamination of dielectric material along with a specifically formed stamp made of soluble material and a thick electrically conducting layer is performed on the printed circuit board.

On top of the electrically conducting layers 22, a lamination of dielectric material 52 along with a specifically formed stamp 53 made of soluble material is done. Simultaneously with the dielectric material, a thick electrically conducting layer 51 is laminated on top of it.

The part made of soluble material features a half-pipe like shape 55 directed towards the side of it. This specific shape is meant to allow a minimum liquid flow to initiate a dissolution step. Other shape can be used for the cavities as long as it permits the liquid flow and hold the lamination pressure.

Preferably the soluble material is soluble into the cooling liquid material which will be used, at least partially, during cooling. For example, the cooling liquid material is water. For example, the soluble material is Polyvinyl alcohol (PVA) which can stand a lamination temperature. For example, the soluble material is Butenediol Vinyl Alcohol Co-polymer. For example, the soluble material is inorganic salts like for example NaCl in a compressed form.

At step 1005, blind vias 60 are mechanically drilled through the thick copper 51 layer up to the thin electrically conducting layer. The vias 51 serve two purposes. The first one is to connect electrically the outer to the inner electrically conducting layer. The second one is to act as pillar for the to-be revealed cavity. These pillars will hold the thick electrically conducting layer bridging over the cavity. The vias 60 are called structural vias. The structural vias are plated for example using copper. The goal of plating the vias 60 is to create a barrier to coolant and only a few tens of micro meter thickness is necessary. The vias 60 may be filled with a polymer resin if extra strength is required.

At step 1006, electrically conducting layers are etched in order to provide electrical connections.

At step 1007, apertures used for the cooling of the power semiconductors are drilled.

The apertures 70 that are used for the cooling are machined by a standard milling/drilling system. Depending on the application, the apertures can be holes or more complex shaped cavities. The depth of this aperture is slightly smaller than the sum of the thick electrically conducting layer and the soluble material. The apertures 70 are located on top of the soluble material and will reveal a half-pipe like shape 55 in the soluble material.

At step S1008, the slots on each side of the printed circuit board are cut-out to allow the liquid to flow.

At step S1010, a nozzle 85 is placed at the entrance of some or all apertures. The solvent is flowing through the apertures and continues through the cavities and finally exits by the side of the printed circuit board. During solvent injection, the material is dissolving and an internal structure is revealed under the thick electrically conducting layer and ends when all the soluble material is fully removed.

At this stage, the pillars surface, the floor and the ceiling of the internal structure 80 are made of electrically conducting material, the other walls are made of dielectric material (prepreg). Generally, the dielectric materials used on printed circuit board manufacturing are hydrophilic and have a tendency to swell after absorbing water-based liquids. To create a coolant tight cavity, an electro-less and an electro-deposition of electrically conducting material is done. As for the structural vias 60, the required thickness for the plating is dictate by the need of having a coating protecting the dielectric material from the coolant.

Naturally, many modifications can be made to the embodiments of the invention described above without departing from the scope of the present invention.

The invention claimed is:

1. A method for making an integrated cooling liquid cavity in a printed circuit board, characterized in that the method comprises the step of:

inserting a power semiconductor die in a dielectric material that forms a first dielectric layer, laminating the dielectric material of the first dielectric layer with a dielectric material that forms a second dielectric layer and a thin inner electrically conducting layer on at least corresponding opposite sides of the first dielectric layer, the inner electrically conducting layer being formed by copper, drilling vias through the laminated copper of the inner electrically conducting layer and dielectric layers, metallizing the vias in order to form a first printed circuit board, laminating the dielectric material of the second dielectric layer with a third dielectric layer, a soluble material having a predetermined form and an outer electrically conducting layer on the first printed circuit board, drilling blind vias through the outer electrically conducting layer to the inner electrically conducting layer, coating/plating the blind vias, filling the blind vias with a polymer resin, injecting solvent in the soluble material in order to dissolve the soluble material and reveal a cavity, injecting cooling liquid in the revealed cavity.

2. The method according to claim 1, characterized in that the method comprises the step, prior injecting the liquid cooling, of coating/plating the revealed cavity.

3. The method according to claim 2, characterized in that the soluble material is Polyvinyl alcohol, Butenediol Vinyl Alcohol Co-polymer or inorganic salts in a compressed form.

4. The method according to claim 1, characterized in that the soluble material is Polyvinyl alcohol, Butenediol Vinyl Alcohol Co-polymer or inorganic salts in a compressed form.

* * * * *